United States Patent
Hasunuma et al.

(10) Patent No.: US 6,765,251 B2
(45) Date of Patent: *Jul. 20, 2004

(54) SEMICONDUCTOR DEVICE HAVING INTERCONNECTION STRUCTURE

(75) Inventors: Eiji Hasunuma, Hyogo (JP); Hideki Genjo, Hyogo (JP); Shigeru Shiratake, Hyogo (JP); Atsushi Hachisuka, Hyogo (JP); Koji Taniguchi, Hyogo (JP)

(73) Assignee: Renesas Technology Corp., Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/227,935

(22) Filed: Jan. 11, 1999

(65) Prior Publication Data

US 2004/0046215 A1 Mar. 11, 2004

(30) Foreign Application Priority Data

Aug. 6, 1998 (JP) .......................................... 10-222824

(51) Int. Cl.⁷ ...................... H01L 27/108; H01L 29/76; H01L 29/94
(52) U.S. Cl. ........................ 257/296; 257/301; 257/306
(58) Field of Search ................................ 257/396, 296, 257/301, 306

(56) References Cited

U.S. PATENT DOCUMENTS

| | | | |
|---|---|---|---|
| 5,629,540 A | 5/1997 | Roh et al. | |
| 5,702,974 A | 12/1997 | Kim | |
| 5,825,059 A | * 10/1998 | Kuroda | ....................... 257/301 |

FOREIGN PATENT DOCUMENTS

| | | |
|---|---|---|
| DE | 4442652 A1 | 1/1996 |
| JP | 7-312416 | 11/1995 |
| JP | 8-162635 | 6/1996 |
| JP | 8-172171 | 7/1996 |
| JP | 9-213802 | 8/1997 |

OTHER PUBLICATIONS

Novel Selective Epi Base for double–poly Structures. In: IBM Technical Disclosures Bulletin, 1992, vol. 35, pp. 51–53.

Pfiester, J.R.; Sivan, R.D.; Gunderson, C.D.; Crain, N.E. (et al.): An ITLDD CMOS Process with Self–Aligned Reverse–Sequence LDD/Channel Implantation. In: IEEE Transactions on electron devices. ISSN 0018–9383. 1991, vol. 38, No. 11, pp. 2460–2464.

Substrate Contact with closed bottom Trenches. In: Research Disclosures, 1991, vol. 322, No. 32246.

Soft error rate reduction in Trench Technology. IBM Technical Disclosures Bulletin 1992, vol. 34, No. 9, pp. 117–118.

* cited by examiner

Primary Examiner—Steven Loke
(74) Attorney, Agent, or Firm—McDermott Will & Emery LLP

(57) ABSTRACT

In the semiconductor device, in order to meet the demand of reduced diameter of a contact hole along with the miniaturization of the semiconductor device, an anti-HF side wall film which is not etched by a hydrofluoric acid, formed of an isolating film such as nitride film, is provided on the side wall of contact hole. Further, a second impurity region which is connected to one of the pair of n type source/drain regions and a first impurity region reaching a p type isolation region are provided in silicon substrate 1 near the lower end of contact hole. Because of this structure, it becomes possible to prevent expansion of the diameter for forming the interconnection layer, as desired in the miniaturized semiconductor device, and therefore a semiconductor device and manufacturing method thereof which stabilize operation characteristic of the semiconductor device can be provided.

3 Claims, 14 Drawing Sheets

SEMICONDUCTOR DEVICE HAVING INTERCONNECTION STRUCTURE

BACKGROUND OF THE INVENTION

1. Field of the Invention

The present invention relates to a semiconductor device and manufacturing method thereof. More specifically, the present invention relates to an improvement of a structure of a semiconductor device allowing improvement in operation characteristic of the semiconductor device, and to manufacturing method thereof.

2. Description of the Background Art

A structure of a conventional semiconductor device will be described with reference to FIG. 15. Referring to FIG. 15, an element isolating oxide film 2 for defining an active region is provided on a main surface of a p type silicon substrate 1. At a position of a prescribed depth from the main surface of p type silicon substrate 1, there is provided a strip shaped p type isolation region 3. In the active region defined by element isolating oxide film 2, an nMOS (Metal Oxide Semiconductor) 100 is formed.

The nMOS 100 has a gate oxide film 4, a gate electrode 5 and a pair of n type source/drain regions 6. The pair of n type source/drain regions 6 are provided on both sides of gate electrode 5. Upper and side surfaces of gate electrode 5 and surfaces of the pair of n type source/drain regions 6 are covered by an oxide film 7, and oxide film 7 is covered by an interlayer oxide film 8.

A bit line 9 is connected to one of the pair of n type source/drain regions 6. Bit line 9 and interlayer oxide film 8 are covered by an interlayer oxide film 10.

On a lower surface of element isolating oxide film 2, an impurity region 12 is provided connected to the other one of the pair of n type source/drain regions 6. A capacitor 200 is connected to impurity region 12 through a contact hole 10a provided piercing through element isolating oxide film 2.

Capacitor 200 has a storage node (lower electrode) 13 directly connected to impurity region 12, a capacitor dielectric film 14, and a cell plate (upper electrode) 15. Capacitor dielectric film 14 and cell plate (upper electrode) 15 are provided to extend over interlayer oxide film 10.

A memory cell of a DRAM (Dynamic Random Access Memory) is formed by nMOS 100 and capacitor 200 described above.

In order to meet the demand of reducing the diameter of a contact hole 15a as the semiconductor device has been miniaturized, a framing film 11 of an oxide such as TEOS (Tetra Etyle Ortho Silicate) is provided on a side wall portion of contact hole 10a.

FIG. 16 shows an impurity concentration profile along a cross section taken along the line X of FIG. 15. Referring to FIG. 16, the line A represents concentration of an n type impurity such as phosphorus, and the line B represents concentration of a p type impurity such as boron. Here, a p type isolation region 3 has a depth of at most 0.55 μm, and impurity region 12 has a depth of 0.1 μm to 0.55 μm.

The method of manufacturing the semiconductor device having the above described structure will be described with reference to FIGS. 17 to 25.

Referring to FIG. 17, element isolating oxide film 2 is formed on the main surface of p type silicon substrate 1 by LOCOS (Local Oxidation of Silicon) method or trench isolation method. Thereafter, an n type impurity is introduced to the entire main surface of p type silicon substrate 1 to form the strip shaped p type isolation region 3.

Referring to FIG. 18, by photo lithography and etching, gate oxide film 4 and gate electrode 5 having prescribed shapes are formed. Thereafter, referring to FIG. 19, using gate electrode 5 as a mask, an n type impurity is introduced to the main surface of p type silicon substrate 1, to form a pair of n type source/drain regions 6.

Then, referring to FIG. 20, oxide film 7 is formed to cover the upper and side surfaces of gate electrode 5 and the surfaces of the pair of n type source/drain regions 6. Further, interlayer oxide film 8 is formed to cover oxide film 7.

Referring to FIG. 21, a contact hole reaching one of the pair of n type source/drain regions 6 is formed in interlayer oxide film 8, and thereafter bit line 9 formed of a conductive layer connected to one of the pair of n type source/drain regions 6 is formed.

Thereafter, referring to FIG. 22, interlayer oxide film 10 is formed to cover interlayer oxide film 8 and bit line 9, and by photo lithography and etching, contact hole 10a passing through interlayer oxide film 10, interlayer oxide film 8, oxide film 7 and element isolating oxide film 2 to reach silicon substrate 1 is formed.

Thereafter, referring to FIG. 23, using contact hole 10a, a n type impurity is introduced to p type silicon substrate 1 to form impurity region 12 which is connected to p type isolation region 3 as well as to the other one of the pair of n type source/drain regions 6.

Introduction of an n type impurity at this time is performed with implantation energy of 100 keV to 200 keV and the dose of $1\times10^{13}$ cm$^{-2}$ to $1\times10^{14}$ cm$^{-2}$. As a result, impurity region 12 comes to have the impurity concentration of about $3\times10^{17}$ cm$^{-3}$ to $3\times10^{18}$ cm$^{-3}$.

Referring to FIG. 24, framing film 11 of an oxide film such as TEOS, is formed to cover an inner portion of contact hole 10a. Then, referring to FIG. 25, framing film 11 on the bottom portion of contact hole 10a and on interlayer oxide film 10 is removed, so as to leave framing film 11 only on the side wall portion of contact hole 10a. Thereafter, in order to remove a natural oxide film formed on the surface of p type silicon substrate 1 exposed at the bottom of contact hole 10a, washing by hydrofluoric acid is performed.

Thereafter, storage node (lower electrode) 13 directly connected to impurity region 12, capacitor dielectric film 14 and cell plate (upper electrode) 15 are formed, and thus a memory cell structure of a DRAM having nMOS 100 and capacitor 200 shown in FIG. 15 is completed.

In the semiconductor device having the above described structure, however, washing with hydrofluoric acid is performed to remove the natural oxide film formed on the p type silicon substrate 1 exposed at the bottom of contact hole 10a, as described above. At this time, framing film 11 of an oxide film such as TEOS provided on the side wall portion of contact hole 10a is etched by the hydrofluoric acid. As a result, framing film 11 is reduced in thickness, resulting in an enlarged diameter of contact hole 10a.

SUMMARY OF THE INVENTION

Therefore, an object of the present invention is to provide a semiconductor device of which operation characteristic is stabilized by preventing enlargement of the diameter for forming inter connection layers as the semiconductor device is miniaturized, and to provide manufacturing method thereof.

According to the present invention, the semiconductor device includes a semiconductor substrate having a main surface, an element isolating region for defining an element framing region on the main surface of the semiconductor substrate, a strip shaped isolation region having a peak of impurity concentration at a prescribed depth from the main surface of the semiconductor substrate, a connection hole provided piercing through the element isolating region, a hydrofluoric acid resistant side wall film which is not etched by hydrofluoric acid (hereinafter referred to as an anti-HF side wall film) provided to cover the side wall of the connection hole, an interconnection layer provided to fill the connection hole, and an impurity region provided on the semiconductor substrate extending from a lower end portion of the connection hole toward the isolation region.

As described above, an anti-HF side wall film which is not etched by hydrofluoric acid is provided on the side wall of the connection hole, and therefore the thickness of the anti-HF side wall film is not changed even after the step of washing using hydrofluoric acid, during manufacturing of the semiconductor device. As a result, smaller diameter of the connection hole required as the semiconductor device has been miniaturized can effectively be attained.

As a preferable embodiment of the semiconductor device, a nitride film is used as the anti-HF side wall film. More preferably, the impurity region includes a first impurity region provided to connect the interconnection layer to the isolation layer, and a second impurity region provided near a lower end of the connection hole to be connected to the interconnection layer.

As the second impurity region is provided near the lower end of the connection hole, the semiconductor substrate near the lower end of the connection hole comes to have lower resistance, and hence it becomes possible to improve operation characteristic of the semiconductor device.

In the semiconductor device in accordance with a preferred embodiment, the anti-HF side wall film is either a polysilicon film or an amorphous silicon film.

As the polysilicon film and the amorphous silicon film are conductive, a trap, which is generated at the semiconductor substrate when the first impurity region reaching the isolation region from the lower end of the connection hole is formed, does not present any problem.

The method of manufacturing the semiconductor device in accordance with the present invention includes the following steps.

First, an element isolating region for defining an element framing region is formed in a semiconductor substrate having a main surface. Thereafter, an impurity is introduced to the entire surface of the semiconductor substrate, and a strip-shaped isolation region having peak impurity concentration at a prescribed depth position from the main surface of the semiconductor substrate is formed.

Thereafter, a connection hole piercing through the element isolating region is formed. Then, an anti-HF side wall film which is not etched by hydrofluoric acid, is formed covering the side wall of connection hole at least near the lower end of the connection hole.

Then, an impurity is introduced to the semiconductor substrate through the connection hole, whereby a first impurity region reaching the isolation region from the lower end of the connection hole is formed. Thereafter, inner portion of the connection hole is washed by hydrofluoric acid. Then, an interconnection layer is formed to fill the inside of the connection hole.

As described above, according to the method of manufacturing a semiconductor device of the present invention, even in the step of washing using hydrofluoric acid, thickness of the anti-HF side wall film is unchanged. As a result, the diameter of the connection hole is effectively reduced, as required along with the miniaturization of the semiconductor device.

Further, in a preferred embodiment of the manufacturing method of the semiconductor device, in the step of forming the anti-HF side wall film, either polysilicon film or an amorphous silicon film is formed. When such a film is used, the thickness of the anti-HF side wall film is unchanged even in the step of washing using hydrofluoric acid. Further, since these films are conductive, the trap generated in the semiconductor substrate when the first impurity region reaching the isolation region from the lower end of the connection hole is formed does not present any problem.

In the preferred embodiment, in the step of forming the anti-HF side wall film, a nitride film is formed, and before the anti-HF side wall film is formed on the side wall of the connection hole, an impurity is introduced to the semiconductor substrate through the connection hole, whereby a second impurity region is formed near the lower end of the connection hole. The thickness of the anti-HF side wall film is unchanged in the step of washing using hydrofluoric acid also in this example using nitride film.

As to the trap generated in the semiconductor substrate when the first impurity region is formed from the lower end of the connection hole to the isolation region, the trap does not present any problem, as the second impurity region is formed near the lower end of the connection hole. Further, as the second impurity region is provided near the lower end of the connection hole, the semiconductor substrate near the lower end of the connection hole comes to have lower resistance, and hence operation characteristic of the semiconductor device can be improved.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiment of the semiconductor device and manufacturing method thereof in accordance with the present invention will be described in the following with reference to the figures.

First Embodiment

The semiconductor device and manufacturing method thereof in accordance with the first embodiment will be described in the following with reference to the figures.

Figure 1:
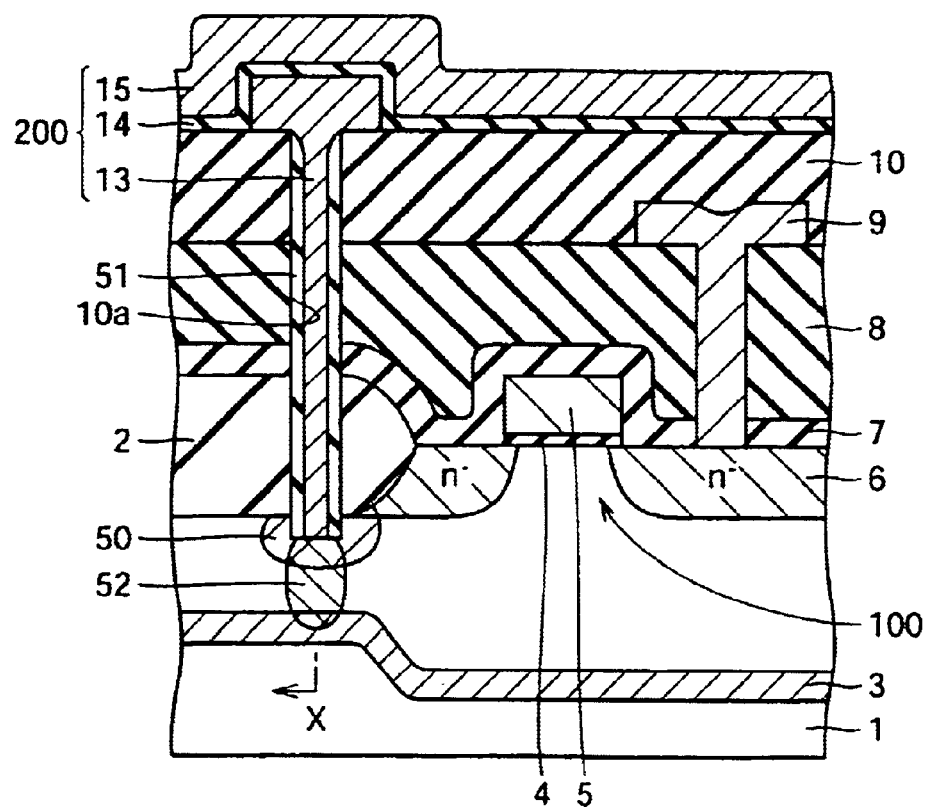
FIG. 1 is a cross section schematically showing a structure of a semiconductor device in accordance with a first embodiment.

Referring to FIG. 1, on a main surface of a p type silicon substrate 1, an element isolating oxide film 2 of a silicon oxide film, for example, for defining an active region is provided. At a prescribed depth position from the main surface of p type silicon substrate 1, a strip shaped p type isolation region 3 is provided. In the active region defined by element isolating oxide film 2, an nMOS 100 is formed.

The nMOS 100 has a gate oxide film 4, a gate electrode 5 and a pair of n type source/drain regions 6. The pair of n type source/drain regions 6 are provided on both sides of gate electrode 5. The upper and side surfaces of gate electrode 5 and surfaces of the pair of n type source/drain region 6 are covered by an oxide film 7 and oxide film 7 is covered by an interlayer oxide film 8.

A bit line 9 is connected to one of the pair of n type source/drain regions 6. Bit line 9 and interlayer oxide film 8 are covered by an interlayer oxide film 10.

In silicon substrate 1 near the lower end portion of contact hole 10a, there are provided a first impurity region 52 reaching the p type isolation region 3 and a second impurity region 50 connected to the other one of the pair of n type source/drain regions 6. To the first impurity region 52, a capacitor 200 as an interconnection layer is connected through a contact hole 10a provided passing through element isolating oxide film 2.

The first impurity region 52 is formed to reach p type isolation region 3 here, in order to lower impurity concentration of p type isolation region 3 by introducing an n type impurity, which is opposite to p type isolation region 3 into silicon substrate 1.

As the impurity concentration of p type isolation region is decreased, it becomes possible to relax electric field in the X direction from the lower end portion of contact hole 10a to p type isolation region 3. As a result, the leakage current through the X direction of the charges from storage node 13 (which will described later) can be reduced, and hence it becomes possible to decrease impurity concentration of a pn junction formed by p type isolation region 3 and n type source/drain region 6.

Capacitor 200 includes a storage node (lower electrode) 13 directly connected to first impurity region 52, a capacitor dielectric film 14 and a cell plate (upper electrode) 15. Capacitor dielectric film 14 and cell plate (upper electrode) 15 are provided to extend over interlayer oxide film 10.

The DRAM memory cell is formed by nMOS 100 and capacitor 200 described above.

In order to meet the demand of reduced diameter of the contact hole 10a along with miniaturization of the semiconductor device, an anti-HF side wall film 51 which is not etched by hydrofluoric acid, formed of an isolating film such as a nitride film is provided.

Figure 2:
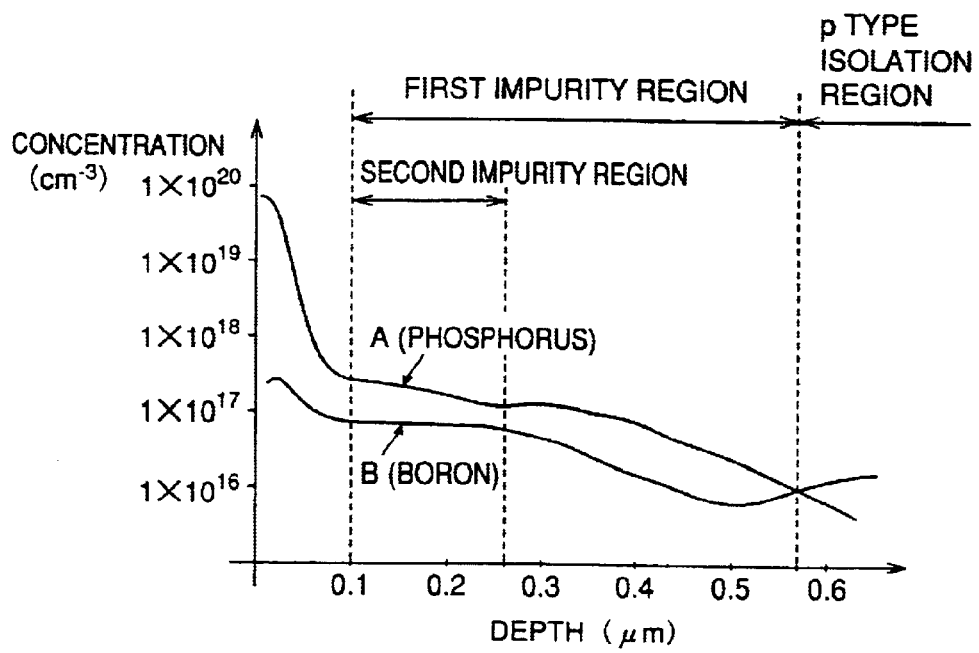
FIG. 2 shows an impurity concentration profile of a cross section taken along the line X of FIG. 1.

FIG. 2 shows an impurity concentration profile of the cross section taken along the line X of FIG. 1. Referring to FIG. 2, the line A represents concentration of the n type impurity such as phosphorus, and the line B represents concentration of the p type impurity such as boron. Here, p type isolation region 3 corresponds to the region of which depth is at most 0.55 $\mu$m, the first impurity region 52 corresponds to the region at the depth of 0.1 $\mu$m to 0.55 $\mu$m, and the second impurity region 50 corresponds to the region having the depths of 0.1 $\mu$m to 0.25 $\mu$m, overlapped with the first impurity region 52.

The method of manufacturing the semiconductor device having the above described structure will be described with reference to FIGS. 3 to 12.

Figure 3:
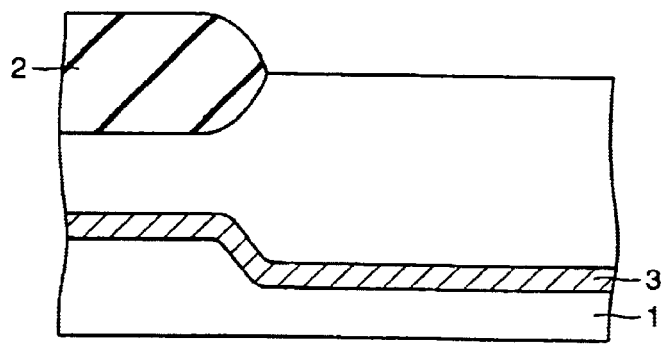
FIGS. 3 to 12 are cross sectional views showing the first to tenth steps of the method of manufacturing the semiconductor device in accordance with a first embodiment.

Referring to FIG. 3, element isolating oxide film 2 is formed by LOCOS (Local Oxidation of Silicon) method or trench isolation method on the main surface of p type silicon substrate 1. Thereafter, an n type impurity is introduced to the entire main surface of p type silicon substrate 1, to form a strip shaped p type isolation region 3. The impurity concentration of p type isolation region 3 is set to be $1\times10^{17}$ $cm^{-3}$ to $5\times10^{17}$ $cm^{-3}$.

Figure 4:
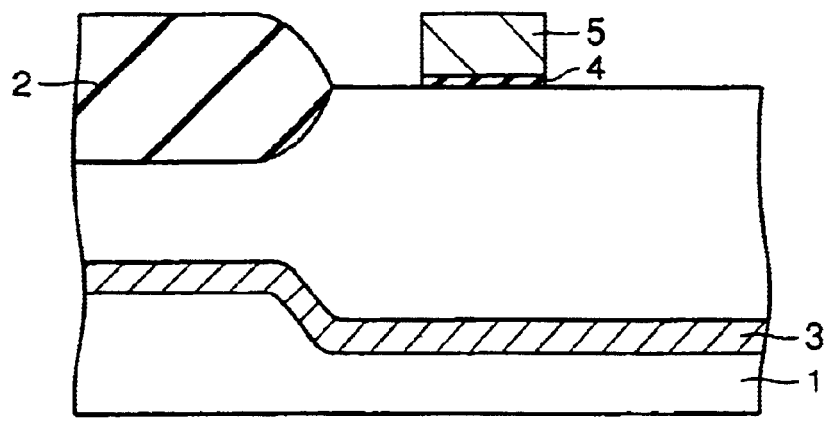
Figure 5:
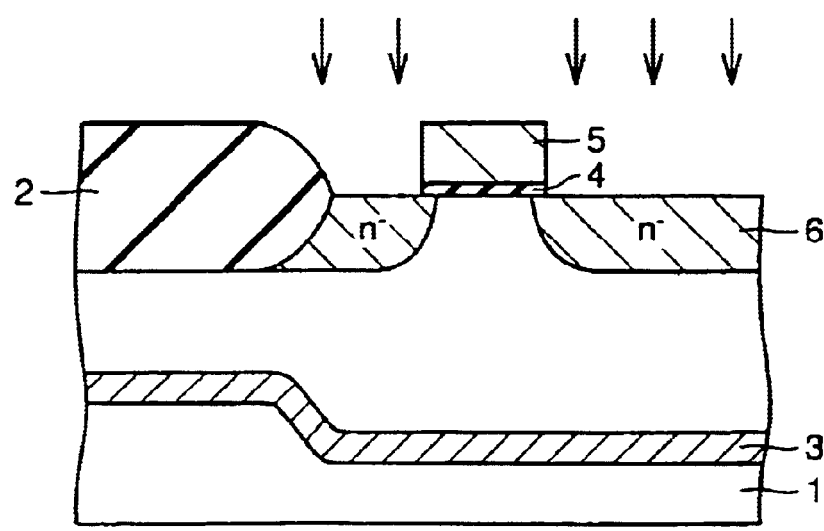

Referring to FIG. 4, thereafter, a gate oxide film 4 and a gate electrode 5 having prescribed shapes are formed by photo lithography and etching. Then, referring to FIG. 5, using a gate electrode 5 as a mask, an n type impurity is introduced to the main surface of p type silicon substrate 1, to form the pair of n type source/drain regions 6. The impurity concentration of the pair of n type source/drain regions 6 is set to be $5\times10^{17}$ $cm^{-3}$ to $1\times10^{18}$ $cm^{-3}$.

Figure 6:
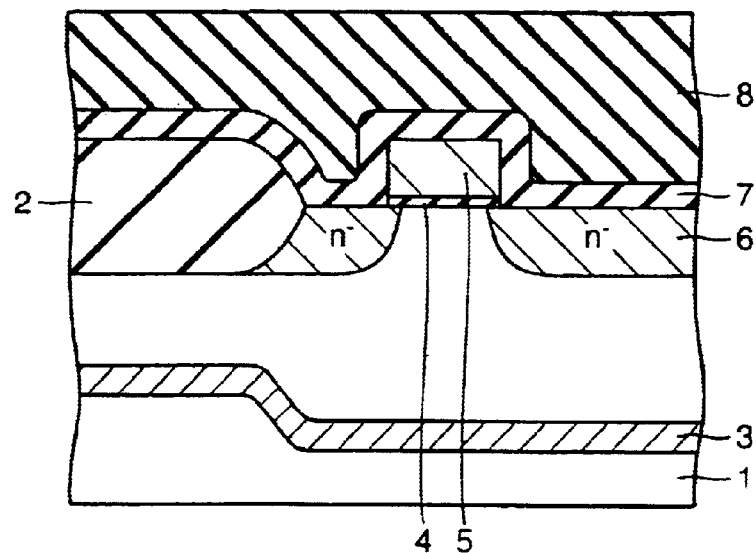

Thereafter, an oxide film 7 is formed to cover the upper and side surfaces of gate electrode 5 and the surfaces of the pair of n type source/drain regions 6, as shown in FIG. 6. Thereafter, an interlayer oxide film 8 is formed to cover oxide film 7.

Figure 7:
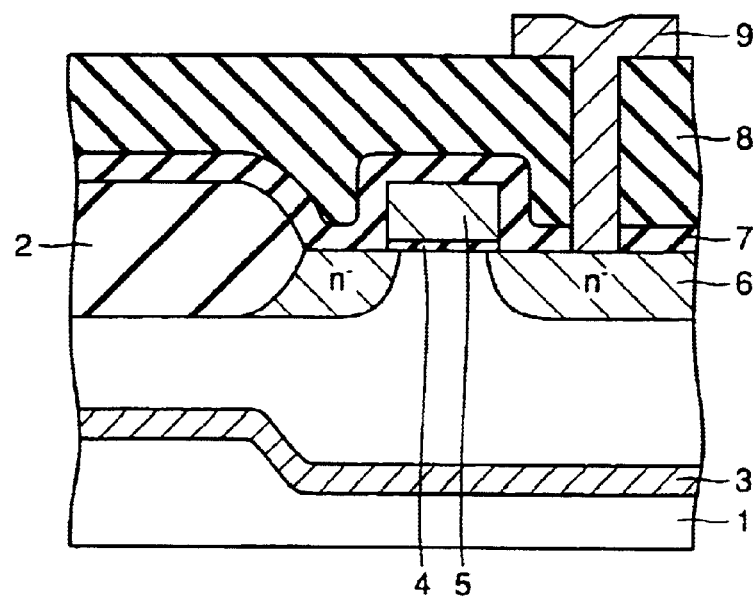

Then, referring to FIG. 7, a contact hole reaching one of the pair of n type source/drain regions 6 is formed through oxide film 7 and interlayer oxide film 8, and a bit line 9 of a conductive layer such as aluminum is formed to be connected to one of the pair of n type source/drain regions 6.

Figure 8:
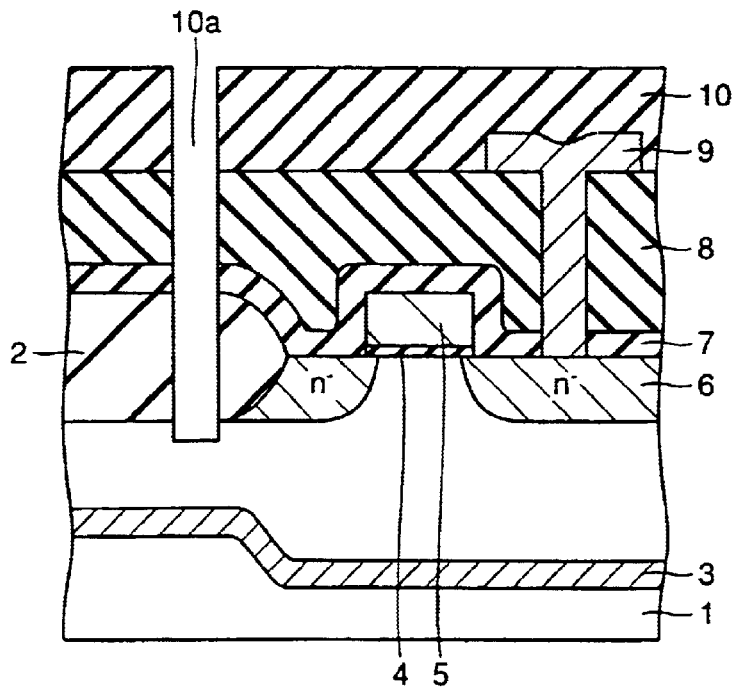

Then, referring to FIG. 8, an interlayer oxide film 10 is formed to cover interlayer oxide film 8 and bit line 9, and thereafter, using photo lithography and etching, a contact hole 10a passing through interlayer oxide film 10, interlayer oxide film 8, oxide film 7 and element isolating oxide film 2 to reach silicon substrate 1 is formed by dry etching. The condition for dry etching is 41 mTorr, 1700 W, $C_4F_8$: 10 sccm, CO: 50 sccm, Ar: 250 sccm, and $O_2$: 5 sccm.

Figure 9:
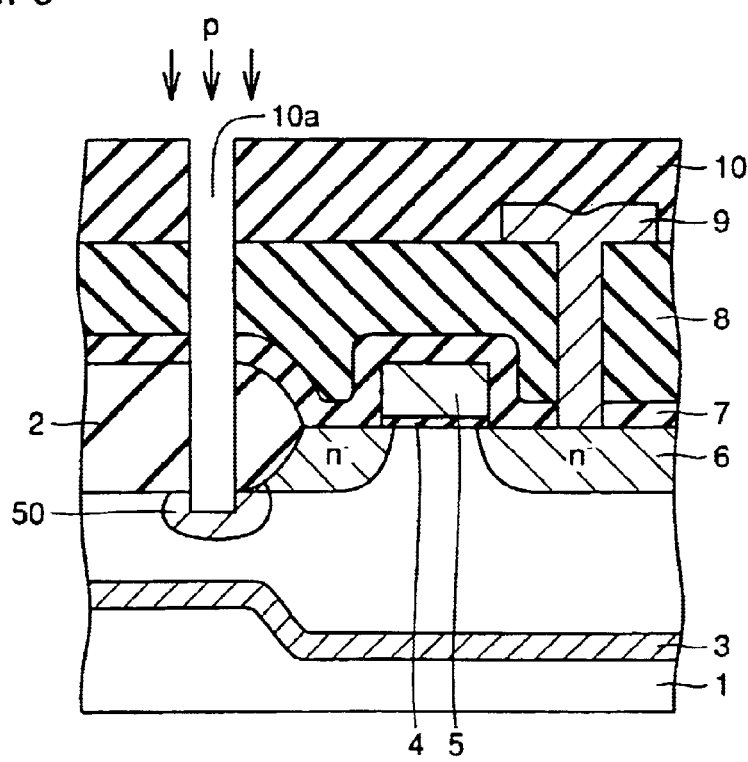

Then, referring to FIG. 9, an n type impurity (for example, phosphorus) is introduced to p type silicon substrate 1 through contact hole 10a, to form a second impurity region 50 connected to the other one of the pair of n type source/drain regions 6.

The condition for n type impurity introduction at this time is implantation energy of 20 keV to 120 keV and the dose of $8\times10^{12}$ $cm^{-2}$ to $8\times10^{13}$ $cm^{-2}$. As a result, the second impurity region 50 comes to have the impurity concentration of about $2\times10^{17}$ $cm^{-3}$ to about $2\times10^{18}$ $cm^{-3}$.

Figure 10:
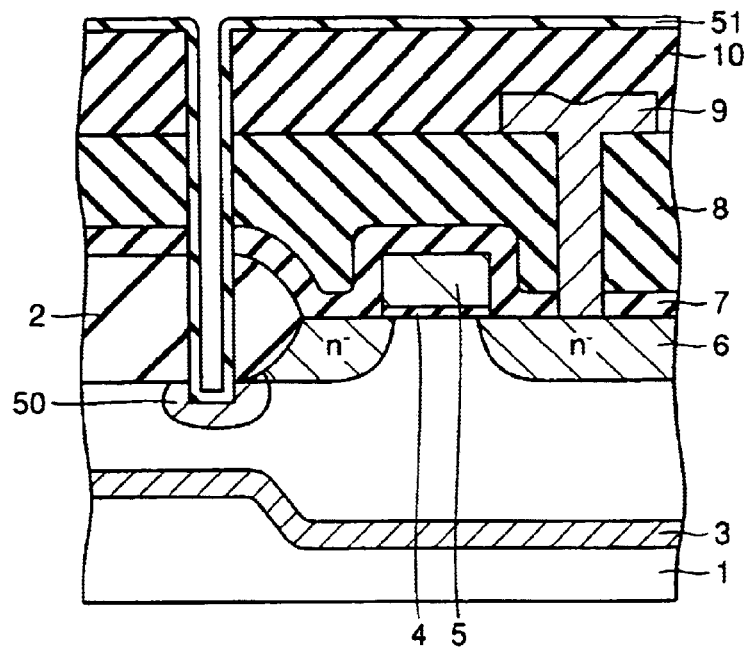
Figure 11:
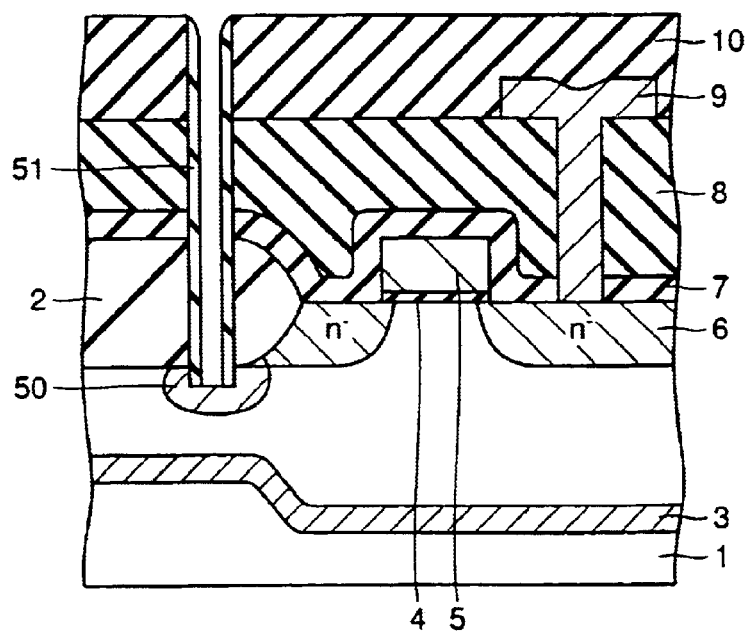

Then, referring to FIG. 10, an anti-HF side wall film 51 of an oxide film is formed to cover an inner portion of contact hole 10a. Then, referring to FIG. 11, anti-HF side wall film 51 on the bottom portion of contact hole 10a and on interlayer oxide film 10 is removed by dry etching, so that anti-HF side wall film 51 is left only on the side wall portions of contact hole 10a. The condition for dry etching is 60 mTorr, 700 W, $CHF_3$: 50 sccm, and Ar: 100 sccm.

Thereafter, in order to remove a natural oxide film formed on the surface of p type silicon substrate 1 exposed at the bottom portion of contact hole 10a, washing with hydrofluoric acid is conducted.

Figure 12:
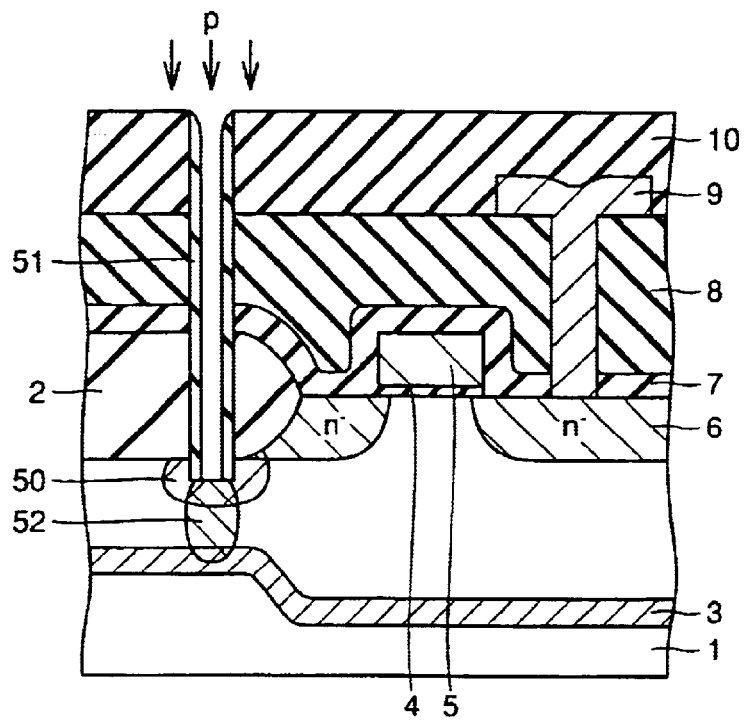

Referring to FIG. 12, an n type impurity region (for example, phosphorus) is introduced to p type silicon substrate 1 through contact hole 10a, and a first impurity region 52 connected to p type isolation region 3 is formed.

The condition for n type impurity implantation at this time is implantation energy of 80 keV to 180 keV and the dose of $8\times10^{12}$ cm$^{-2}$ to $8\times10^{13}$ cm$^{-3}$. As a result, the first impurity region 52 comes to have the impurity concentration of about $2\times10^{17}$ cm$^{-3}$ to about $2\times10^{13}$ cm$^{-3}$.

Then, a storage node (lower electrode) 13 directly connected to the first impurity region 52, a capacitor dielectric film 14 and a cell plate (upper electrode) 15 are formed, and thus the DRAM memory cell structure in accordance with the embodiment having nMOS 100 and capacitor 200 shown in FIG. 1 is complete.

According to the semiconductor device and manufacturing method thereof in accordance with the present embodiment, even when a nitride film is used, the nitride film used as the anti-HF side wall film 51, and therefore thickness of anti-HF side wall film 51 is unchanged in the step of washing using hydrofluoric acid. Therefore, refresh characteristic of the DRAM can be improved.

As to the trap generated in the silicon substrate 1 when the first impurity region 52 reaching isolation region 3 from the lower end of contact hole 10a, the trap does not present any problem, as the second impurity region 50 is formed in silicon substrate 1 near the lower end of contact hole 10a.

Further, as the second impurity region 50 is provided in silicon substrate 1 near the lower end of contact hole 10a, silicon substrate 1 near the lower end of contact hole 10a comes to have lower resistance, which allows improved write characteristic of the DRAM.

Second Embodiment

The semiconductor device and manufacturing method thereof in accordance with the second embodiment will be described with reference to the FIG. 13.

Figure 13:
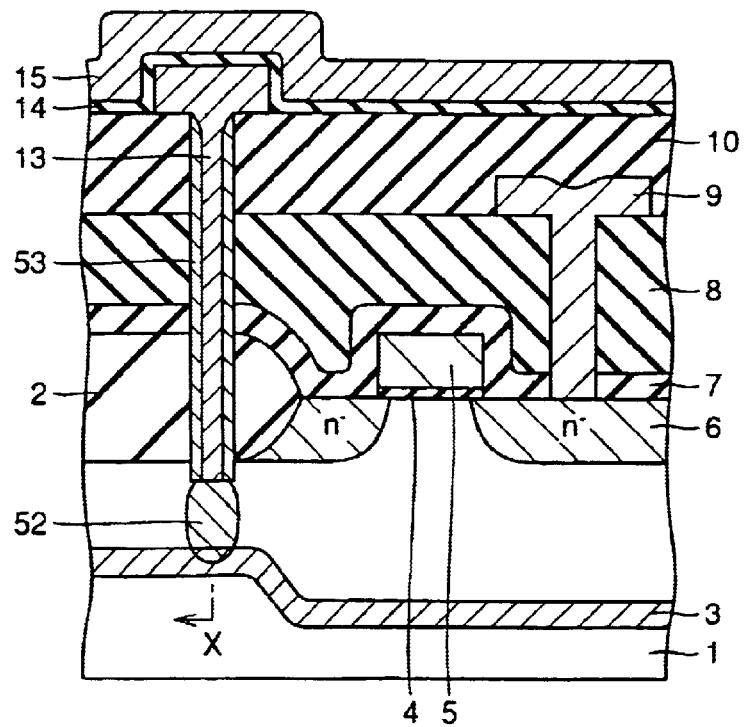
FIG. 13 is a cross sectional view schematically showing the structure of the semiconductor device in accordance with a second embodiment.

Referring to FIG. 13, the semiconductor device of the present embodiment is basically the same in structure as the semiconductor device in accordance with the first embodiment described above. Therefore, only the difference will be described in detail.

Portions corresponding to those of the semiconductor device in accordance with the first embodiment are denoted by the same reference characters. In the semiconductor device according to the present embodiment, in place of the anti-HF side wall film 51 formed of a nitride film in the first embodiment, an anti-HF side wall film 53 formed of a conductive film such as polysilicon or amorphous silicon is formed on the side wall portion of contact hole 10a.

Even when the anti-HF side wall film 53 which is a conductive film is used, the thickness of the anti-HF side wall film is unchanged in the step of washing using hydrofluoric acid. Therefore, it becomes possible to improve refresh characteristic of the DRAM.

Further, anti-HF side wall film 53 is formed of a conductive film, the trap generated in silicon substrate 1 when the first impurity region 52 reaching isolation region 3 from the lower end of contact hole 10a described in the first embodiment is formed does not present any problem. As a result, it is not necessary in the present embodiment to form the second impurity region 50 in silicon substrate 1 near the lower end of contact hole 10a.

Third Embodiment

The semiconductor device in accordance with the third embodiment will be described with reference to the FIG. 14.

Figure 14:
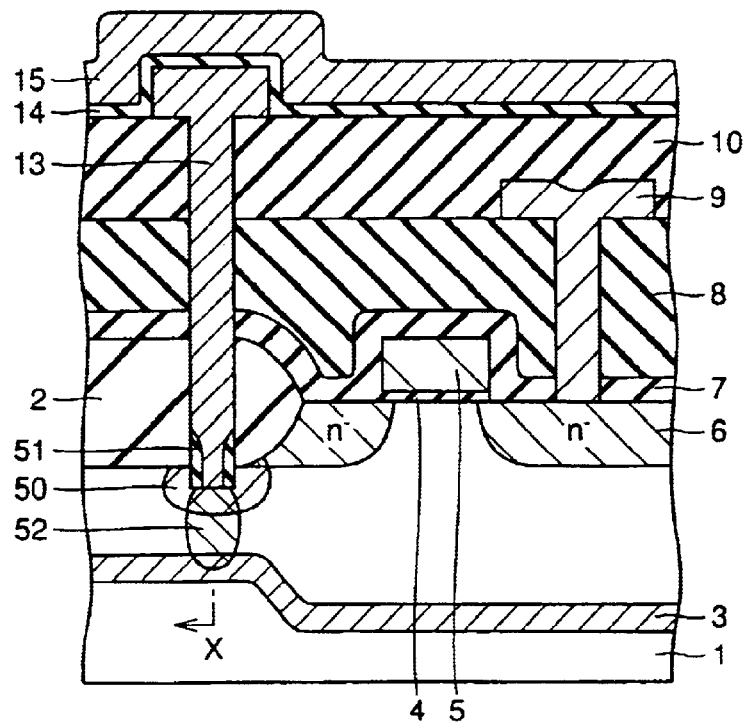
FIG. 14 is a cross sectional view schematically showing a structure of a semiconductor device in accordance with a third embodiment.
Figure 15:
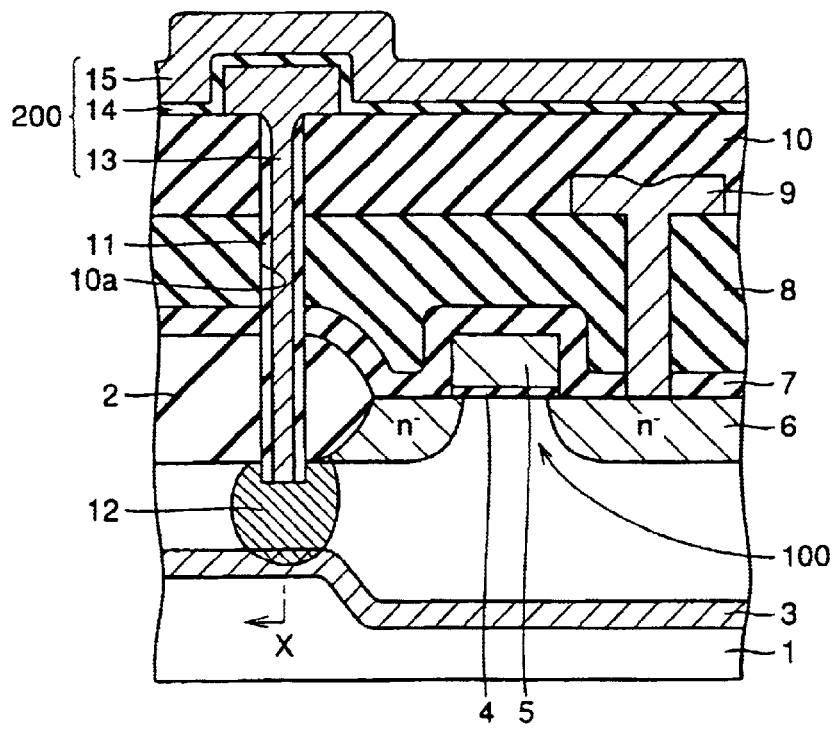
FIG. 15 is a cross sectional view schematically showing a structure of a semiconductor device in accordance with the prior art.
Figure 16:
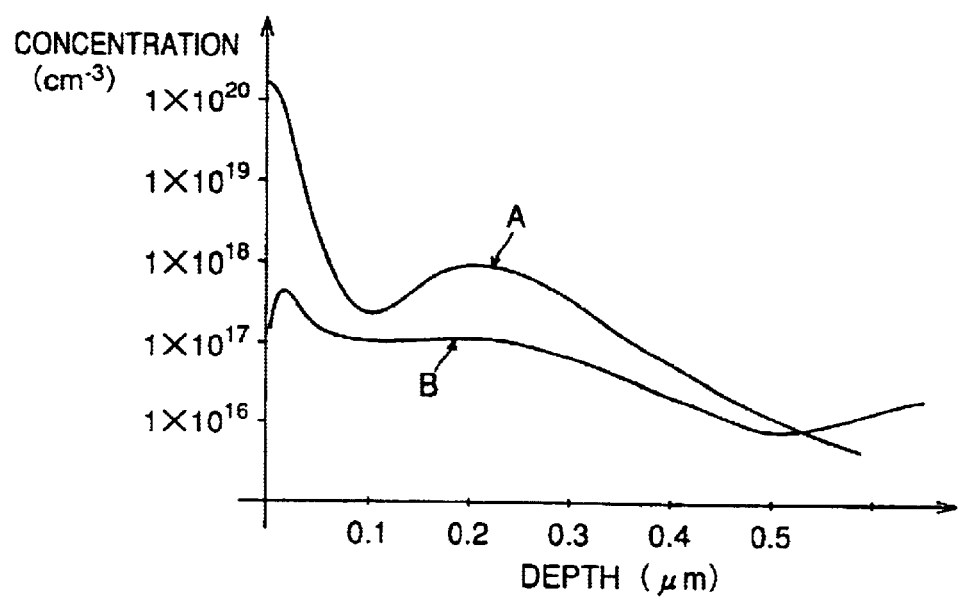
FIG. 16 shows an impurity concentration profile of a cross section taken along the line X in FIG. 15.
Figure 17:
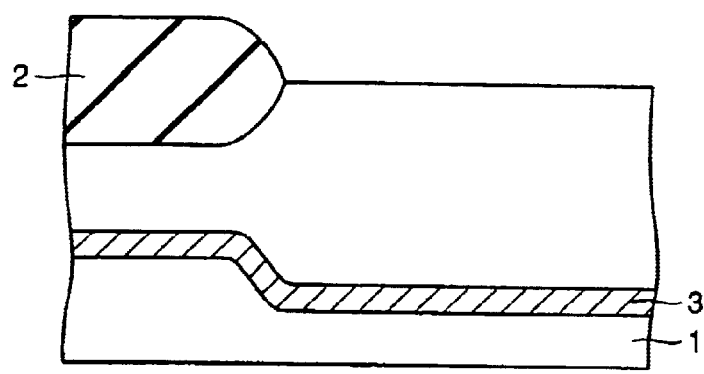
FIGS. 17 to 25 are cross sectional view showing the first to ninth steps of a method of manufacturing the semiconductor device in accordance with the prior art.
Figure 18:
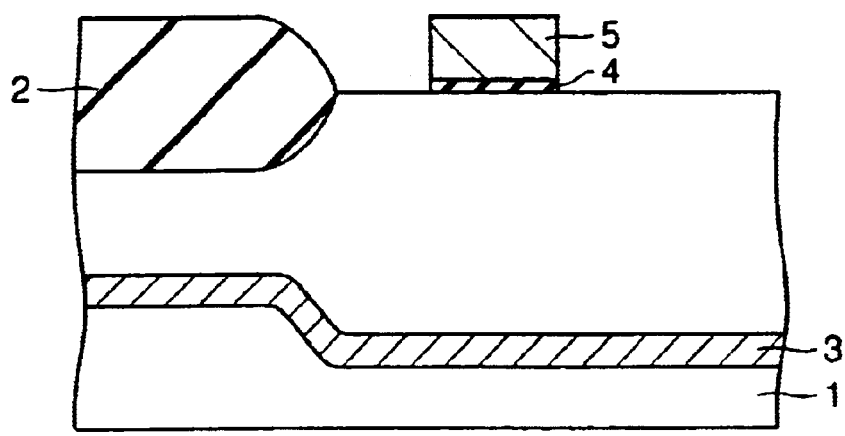
Figure 19:
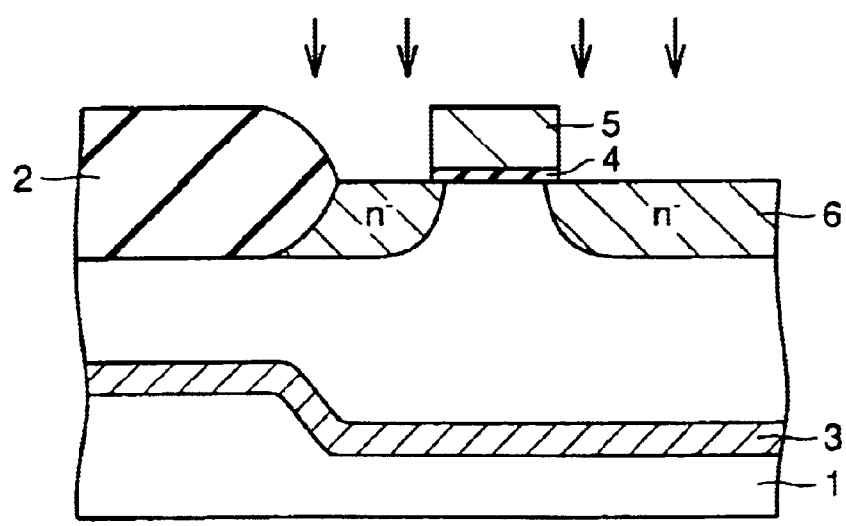
Figure 20:
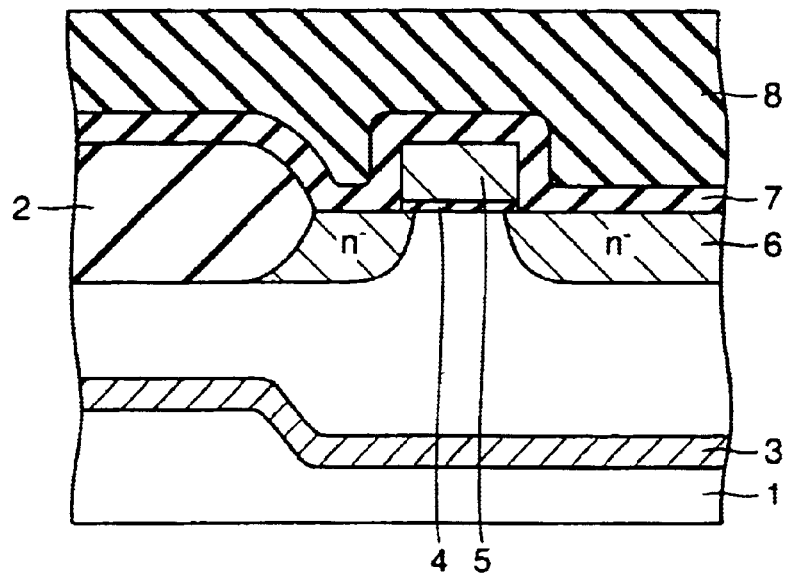
Figure 21:
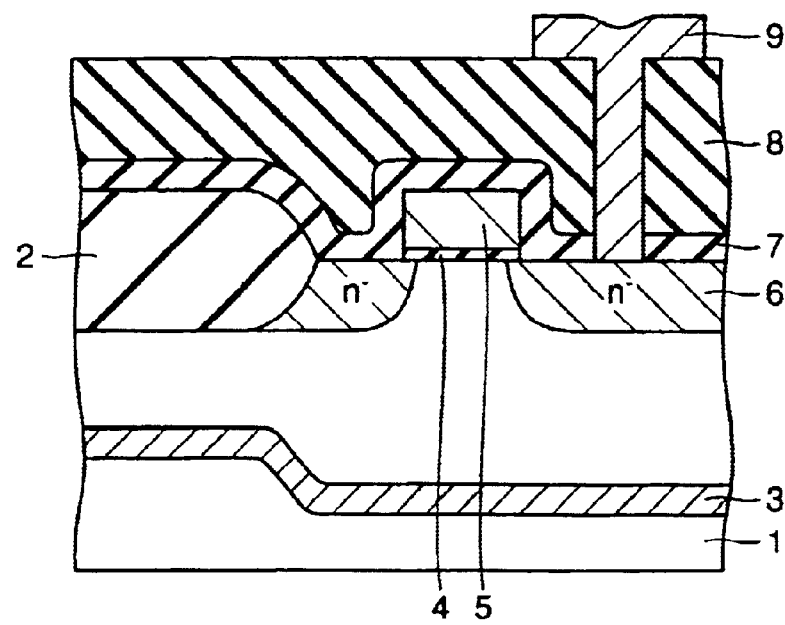
Figure 22:
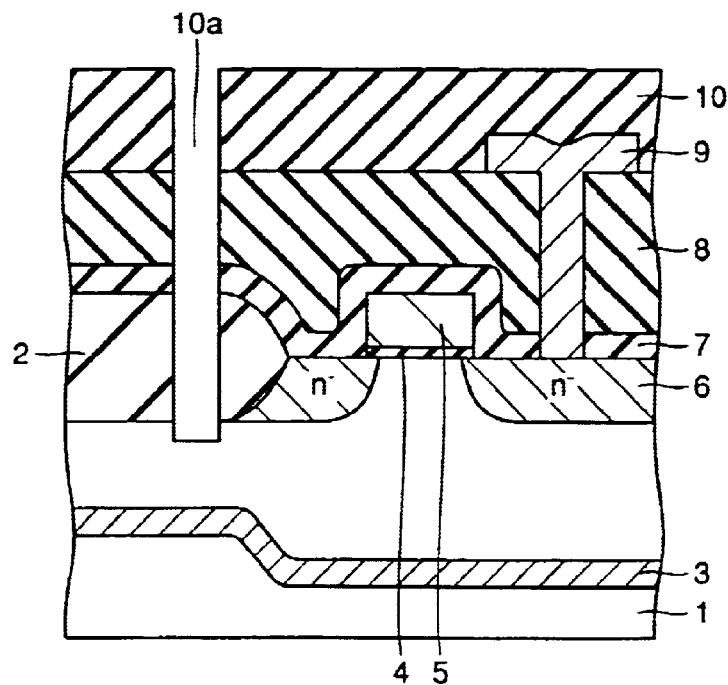
Figure 23:
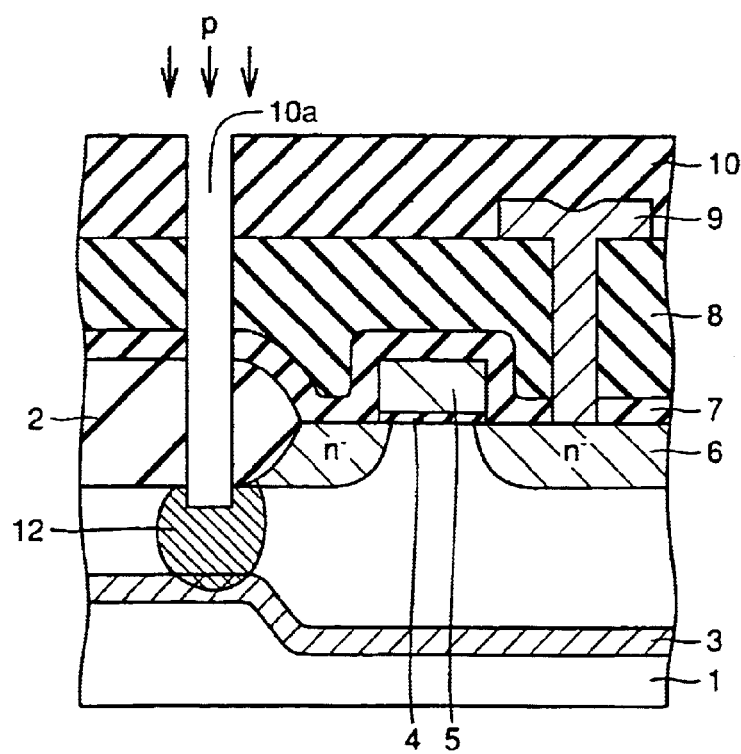
Figure 24:
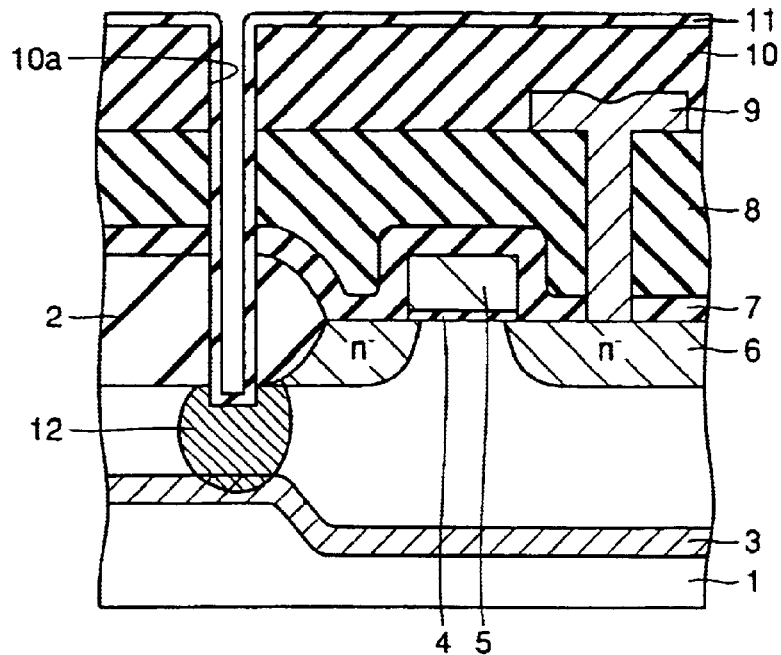
Figure 25:
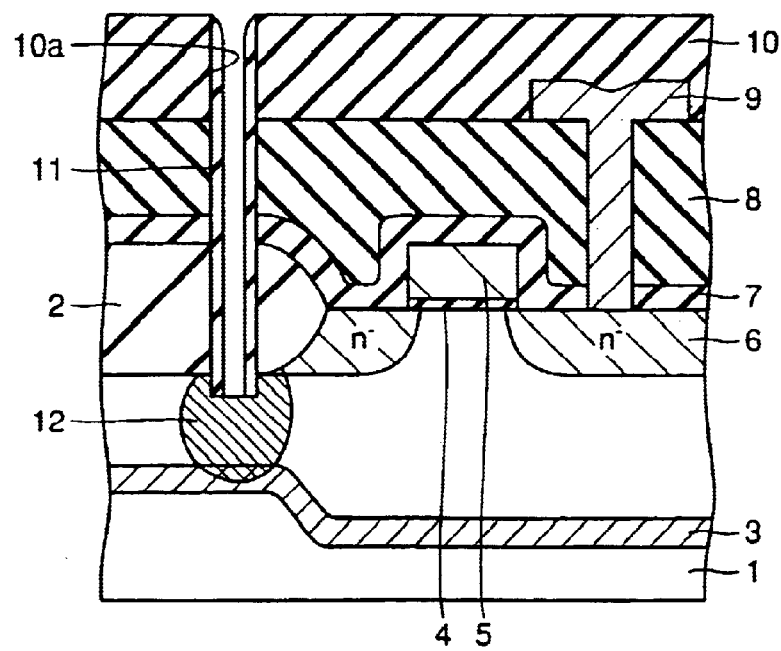
Figure 26:
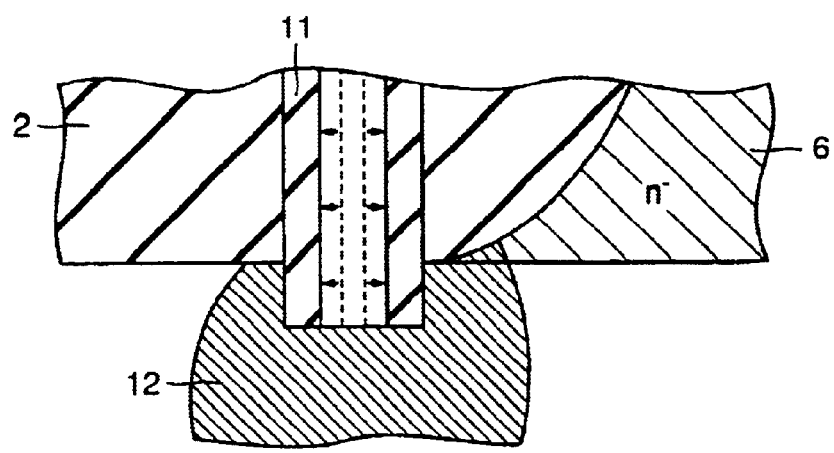
FIG. 26 is a schematic diagram showing the problems of the semiconductor device and the manufacturing method thereof in accordance with the prior art.

Referring to FIG. 14, the semiconductor device in accordance with the present embodiment is basically the same in structure as the semiconductor device in accordance with the first embodiment described above. Therefore, only the difference will be described in detail. Portions corresponding to those of the semiconductor device in accordance with the first embodiment will be denoted by the same reference characters.

In the semiconductor device in accordance with the present embodiment, the anti-HF side wall film 51 formed of a nitride film in the first embodiment is formed only in the vicinity of a lower end portion of the side wall of contact hole 10a. Formation of anti-HF side wall film 51 with reduced height is possible by appropriately selecting the condition of dry etching in the step of dry etching shown in FIG. 11 of the first embodiment.

Similar function and effect as in the first embodiment can be obtained in the semiconductor device in accordance with the third embodiment.

The embodiments described above are exemplary and not limiting. Though an insulating film of a nitride film, a polysilicon or an amorphous conductive film has been described as the anti-HF side wall film, any material may be used provided that it has slower etching rate than an oxide film such as TEOS with respect to hydrofluoric acid. If the material is an insulator, the structure similar to the first embodiment may be used and if the material is a conductor, a structure similar to that of the second embodiment may be used, to obtain similar function and effects as in the first and second embodiments.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device, comprising:

a semiconductor substrate having a main surface;

an element isolating region for defining an element forming region on the main surface of said semiconductor substrate;

an isolation region having a strip-shape and having a peak impurity concentration at a prescribed depth position from the main surface of said semiconductor substrate;

a connection hole provided piercing through said element isolating region;

an anti-HF (hydrofluoric acid) side wall film not etched by hydrofluoric acid, provided to cover a side wall of said connection hole at least near a lower end of said connection hole;

an interconnection layer provided to fill an inner portion of said connection hole; and an impurity region provided in said semiconductor substrate extending from the lower end of said connection hole to said isolation region, wherein said impurity region comprises a first impurity region portion provided to connect said interconnection layer to said isolation region, and a second impurity region portion provided near the lower end of said connection hole and connected to said interconnection layer, the first impurity region portion being approximately equal in width to the internal diameter of the connection hole and the width of the second impurity region portion being substantially greater than the internal diameter of the connection hole.

2. The semiconductor device according to claim 1, wherein said anti-HF side wall film is a nitride film.

3. The semiconductor device according to claim 1, wherein said anti-HF side wall film is either a polysilicon film or an amorphous silicon film.

* * * * *